US011112230B2

(12) United States Patent
Latham et al.

(10) Patent No.: US 11,112,230 B2
(45) Date of Patent: Sep. 7, 2021

(54) ANGLE SENSOR USING EDDY CURRENTS

(71) Applicant: Allegro MicroSystems, LLC, Manchester, NH (US)

(72) Inventors: Alexander Latham, Harvard, MA (US); Maxim Klebanov, Manchester, NH (US)

(73) Assignee: Allegro Microsystems, LLC, Manchester, NH (US)

( * ) Notice: Subject to any disclaimer, the term of this patent is extended or adjusted under 35 U.S.C. 154(b) by 158 days.

(21) Appl. No.: 16/282,539

(22) Filed: Feb. 22, 2019

(65) Prior Publication Data

US 2019/0265018 A1 Aug. 29, 2019

Related U.S. Application Data

(60) Provisional application No. 62/634,370, filed on Feb. 23, 2018.

(51) Int. Cl.
*G01B 7/30* (2006.01)
*G01D 5/20* (2006.01)
*G01R 33/00* (2006.01)
*G01R 33/028* (2006.01)
*G01R 33/06* (2006.01)

(52) U.S. Cl.
CPC ............ *G01B 7/30* (2013.01); *G01D 5/2053* (2013.01); *G01R 33/0017* (2013.01); *G01R 33/0283* (2013.01); *G01R 33/066* (2013.01)

(58) Field of Classification Search
CPC ..... G01B 7/30; G01D 5/2053; G01R 33/0017
See application file for complete search history.

(56) References Cited

U.S. PATENT DOCUMENTS

| 6,111,403 | A  | * | 8/2000  | Yokotani ............ G01R 33/093 |
|           |    |   |         | 324/207.21 |
| 6,642,711 | B2 |   | 11/2003 | Kawate et al. |
| 7,009,384 | B2 | * | 3/2006  | Heremans ............ G01D 5/147 |
|           |    |   |         | 324/165 |
| 7,768,083 | B2 | * | 8/2010  | Doogue ............... H01L 43/065 |
|           |    |   |         | 257/422 |
| 10,145,908 | B2 |   | 12/2018 | David et al. |
| 10,495,699 | B2 | * | 12/2019 | Burdette ............ G01R 33/093 |
| 2005/0225320 | A1 |   | 10/2005 | Lee |
| 2006/0104558 | A1 |   | 5/2006  | Gallion et al. |
| 2007/0001666 | A1 |   | 1/2007  | Lee |
| 2015/0022193 | A1 |   | 1/2015  | Burdette et al. |

(Continued)

OTHER PUBLICATIONS

Response (with Amended Claims) to European Official Communication dated Sep. 2, 2019 for European Application No. 19158961.3; Response filed Feb. 24, 2020; 44 Pages.

(Continued)

*Primary Examiner* — Reena Aurora
(74) *Attorney, Agent, or Firm* — Daly, Crowley, Mofford & Durkee, LLP

(57) ABSTRACT

Methods and apparatus for a sensor with a main coil to direct a magnetic field at a rotating target for inducing eddy currents in an end of the target and a sensing element to detect a magnetic field reflected from the target, wherein the target end comprises a conductive surface. The reflected magnetic field can be processed to determine an angular position of the target.

84 Claims, 14 Drawing Sheets

(56) References Cited

U.S. PATENT DOCUMENTS

| | | | |
|---|---|---|---|
| 2015/0362336 A1* | 12/2015 | Cook | G01D 5/2275 324/207.16 |
| 2018/0340911 A1 | 11/2018 | Romero | |
| 2018/0340986 A1 | 11/2018 | Latham et al. | |
| 2018/0340987 A1 | 11/2018 | Latham et al. | |
| 2018/0340988 A1 | 11/2018 | Latham et al. | |
| 2018/0340989 A1 | 11/2018 | Latham et al. | |
| 2018/0340990 A1 | 11/2018 | Latham et al. | |

OTHER PUBLICATIONS

European Extended Search Report dated Jul. 12, 2019 for European Application No. 19158961.3; 10 Pages.

European Intention to Grant dated Mar. 10, 2021 for European Application No. 19158961.3; 7 Pages.

* cited by examiner

*FIG. 5*
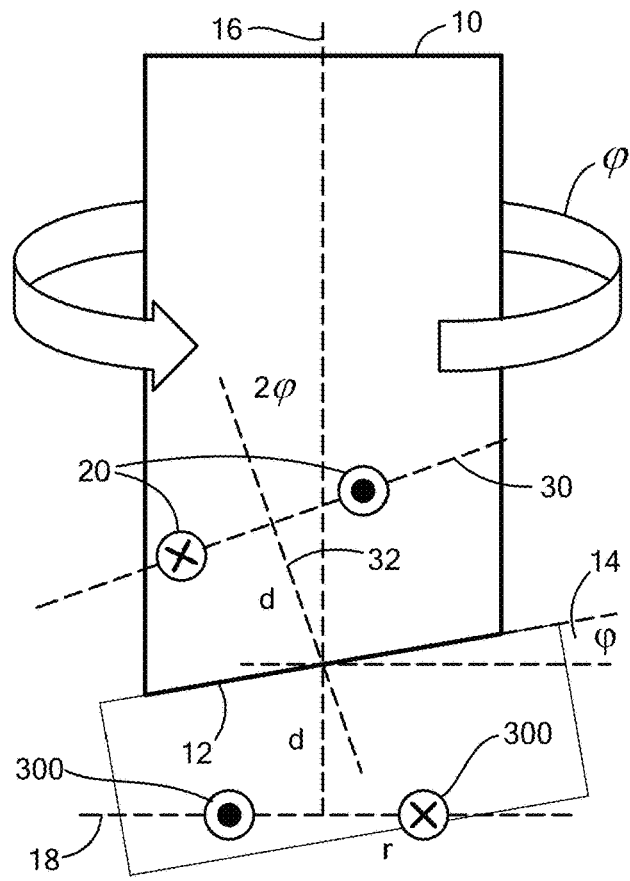
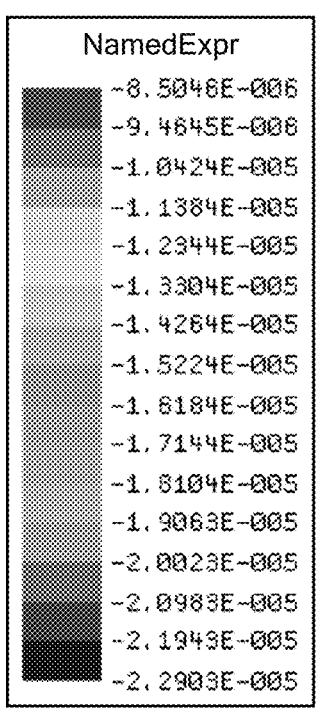
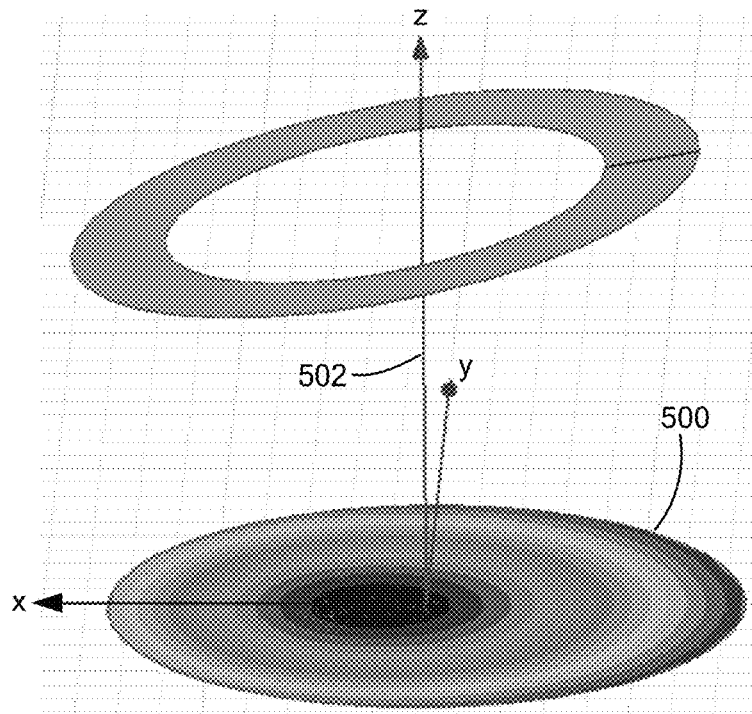

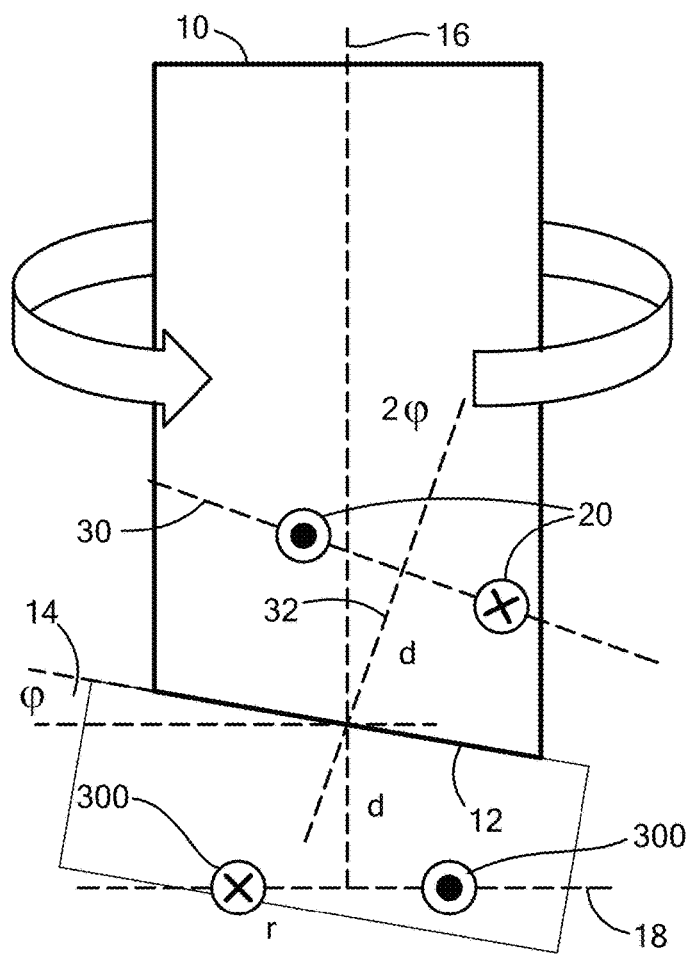
FIG. 5A
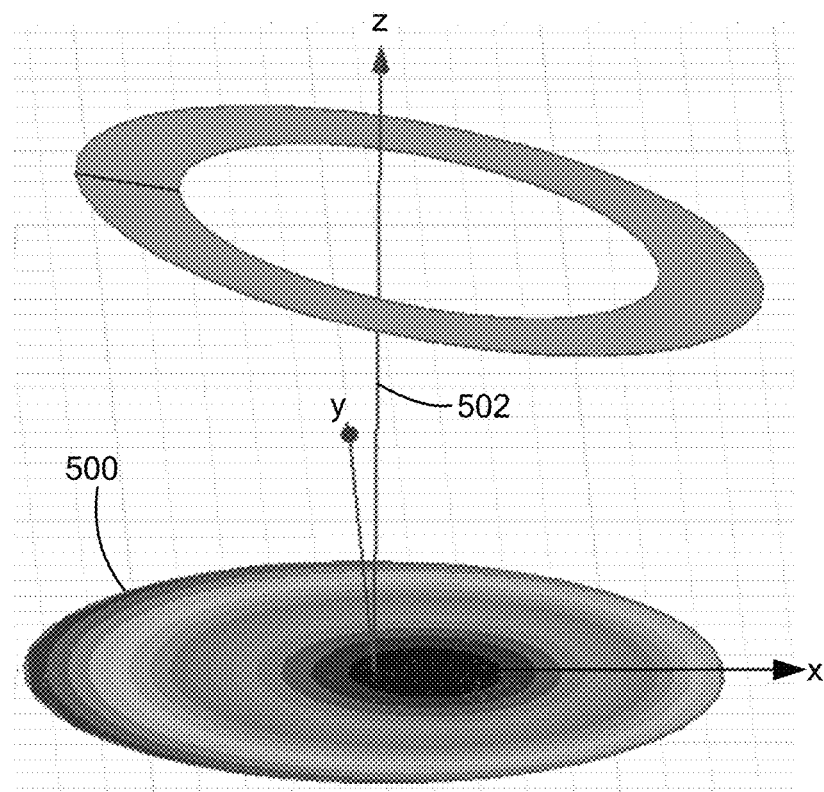
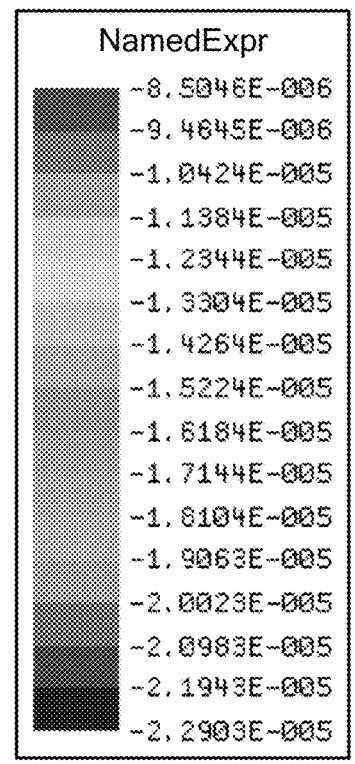

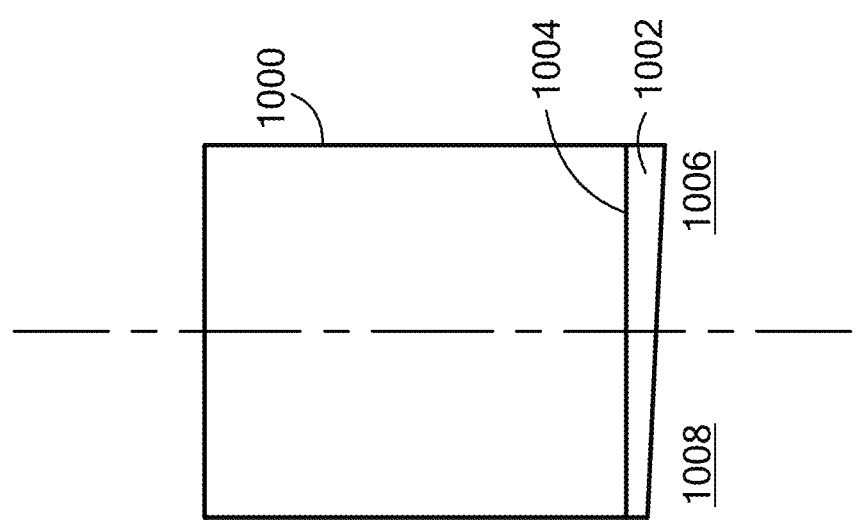
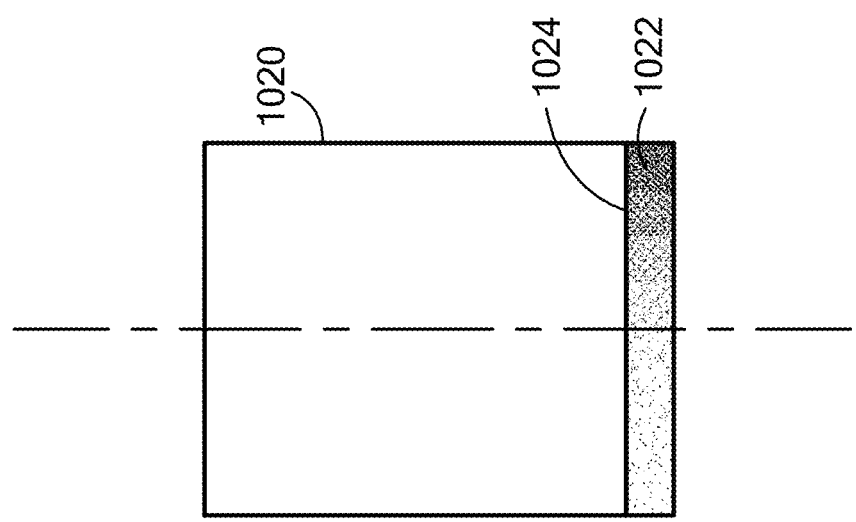
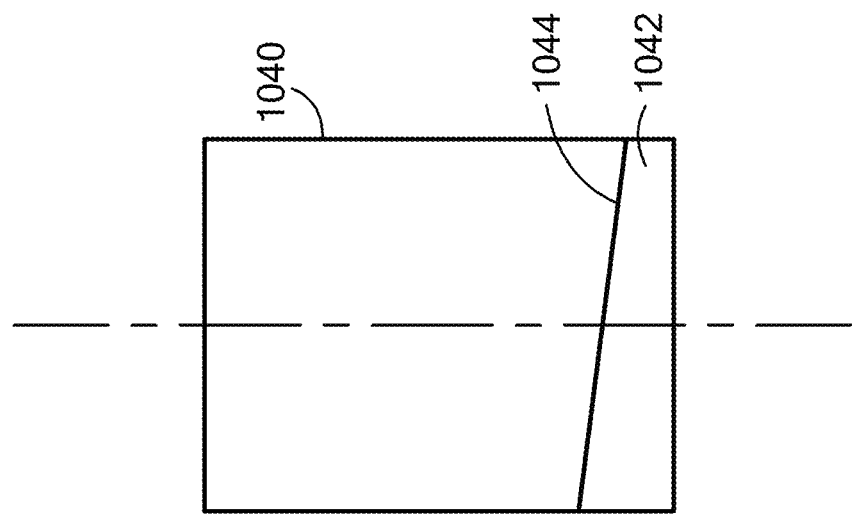

ANGLE SENSOR USING EDDY CURRENTS

CROSS REFERENCE TO RELATED APPLICATIONS

The present application claims the benefit of U.S. Provisional Patent Application No. 62/634,370 filed on Feb. 23, 2018, which is herein incorporated by reference.

BACKGROUND

Magnetic field sensors are often used to detect a ferromagnetic target. For example, it is common to use high frequency magnetic field generation and detection to determine features of a conductive target. In particular, in NDT (Non-Destructive Testing) this is done to detect cracks or other defects in metals. Magnetic field sensors may act as sensors to detect motion or position of the target. Such sensors are ubiquitous in many areas of technology including robotics, automotive, manufacturing, etc. For example, a magnetic field sensor may be used to detect when a vehicle wheel locks up, triggering the vehicle control processor to engage the anti-lock braking system. In this example, the magnetic field sensor may detect rotation of the wheel. Magnetic field sensors may also detect distance to an object. For example, a magnetic field sensor may be used to detect the position of a hydraulic piston. Magnetic field sensors are also used to determine angular position information for a rotating target.

SUMMARY

The present invention provides method and apparatus for angle sensors having a main coil to generate magnetic fields that are reflected by a target with a conductive surface. The reflected field is generated by eddy currents in the conductive surface of the target. In embodiments, a target comprises a cylinder with an end cut at an angle. Magnetic field sensors, e.g., pick-up coils, can pick up the reflected field, which can be processed to determine an angular position of the target. In embodiments, quadrature pick up coils can be used to receive the reflected field and generate sine and cosine signals for processing.

In embodiments, a main coil directs a magnetic field at a conductive target for inducing eddy currents in the target with one or more differential pick-up coils for detecting the reflected field from the target. In embodiments, the pick-up coil(s) are such that the average field from the main coil on a pick-up coil(s) is substantially zero. The average reflected field seen by the pick-up coil(s) is dependent on the angle of the surface of the conductive target in relation to the main and pick-up coil(s). A processing module is configured to process the reflected field seen by the pick-up coil(s) and determine the angular position of the target.

In one aspect, a sensor comprises: a main coil to direct a magnetic field at a rotatable target for inducing eddy currents in the target; differential pick-up coils for detecting a reflected field from the target wherein each of the pick-up coils is configured such that an asymmetric reflected field from the target seen by the pick-up coils corresponds to conductive properties of a surface of the target in relation to the main coil and the pick-up coils; and a processing module to process the reflected magnetic field from the pick-up coils for determining an angular position of the target.

A sensor can further include one or more of the following features: the target is configured to rotate about an axis of the target, the target comprises a cylinder and an end of the cylinder is cut at an angle corresponding to the asymmetric reflected field from the target, the angle corresponds to locations of eddy currents generated in the target by the main coil, the reflected field is generated by the induced eddy currents in the conductive surface, and wherein the reflected field is asymmetrical about an axis of the target, each of the pick-up coils is configured such that an average field from the main coil on the pick-up coils is substantially zero, a first one of the pick-up coils generates a sine signal corresponding to the angular position of the target and a second one of the pick-up coils includes a cosine signal corresponding to the angular position of the target, the processing module is configured for arc tangent processing of the sine and cosine signals to determine the angular position of the target, a strength of the reflected magnetic field corresponds to a distance between the end of the target and the main coil, an end of the target comprises a conductive material defining the conductive properties of the surface of the target, the conductive material varies in thickness to vary the conductivity of the end of the target, the pick-up coils comprise first and second matching coils that are ninety degrees out of phase with respect to each other, at least one ground plane is placed between the main and/or pick-up coils, the at least one ground plane includes at least one slot to reduce eddy current generation from the main coil, the main coil and pick-up coils are at least partially interdigitated, the sensor is formed on a single integrated circuit, one or more of the main coil and the pick-up coils is on a separate substrate, the pick-up coils comprise two half spirals, and/or the pick-up coils comprise concentric coils.

In another aspect, a method comprises: employing a main coil to direct a magnetic field at a rotatable target for inducing eddy currents in the target; employing differential pick-up coils for detecting a reflected field from the target wherein each of the pick-up coils is configured such that an asymmetric reflected field from the target seen by the pick-up coils corresponds to conductive properties of a surface of the target in relation to the main coil and the pick-up coils; and processing the reflected magnetic field from the pick-up coils for determining an angular position of the target.

A method can further include one or more of the following features: the target is configured to rotate about an axis of the target, the target comprises a cylinder and an end of the cylinder is cut at an angle corresponding to the asymmetric reflected field from the target, the angle corresponds to locations of eddy currents generated in the target by the main coil, the reflected field is generated by the induced eddy currents in the conductive surface, and wherein the reflected field is asymmetrical about an axis of the target, each of the pick-up coils is configured such that an average field from the main coil on the pick-up coils is substantially zero, a first one of the pick-up coils generates a sine signal corresponding to the angular position of the target and a second one of the pick-up coils includes a cosine signal corresponding to the angular position of the target, the processing module is configured for arc tangent processing of the sine and cosine signals to determine the angular position of the target, a strength of the reflected magnetic field corresponds to a distance between the end of the target and the main coil, an end of the target comprises a conductive material defining the conductive properties of the surface of the target, the conductive material varies in thickness to vary the conductivity of the end of the target, the pick-up coils comprise first and second matching coils that are ninety degrees out of phase with respect to each other, at least one ground plane is placed between the main and/or pick-up coils, the at least one ground plane includes at least one slot to reduce eddy current generation from the main coil, the main coil and pick-up coils are at least partially interdigitated, the sensor is formed on a single integrated circuit, one or more of the main coil and the pick-up coils is on a separate substrate, the pick-up coils comprise two half spirals, and/or the pick-up coils comprise concentric coils.

In a further aspect, a sensor comprises: a main coil means for directing a magnetic field at a rotatable target for inducing eddy currents in the target; differential pick-up coil means for detecting a reflected field from the target wherein the differential pick-up coil means comprises pick up coils each configured such that an asymmetric reflected field from the target seen by the pick-up coils corresponds to conductive properties of a surface of the target in relation to the main coil means and the pick-up coils; and a processing means for processing the reflected magnetic field from the pick-up coils for determining an angular position of the target.

BRIEF DESCRIPTION OF THE DRAWINGS

The foregoing features of this invention, as well as the invention itself, may be more fully understood from the following description of the drawings in which:

FIG. 5 is a schematic representation of a target and a field reflected by the target in accordance with example embodiments of the invention;

FIG. 5A is a schematic representation of a target and a field reflected by the target that is rotated from its position in FIG. 5 in accordance with example embodiments of the invention;

FIG. 10A is a schematic representation of a target having an end surface with non-uniform layer of conductive material in accordance with example embodiments of the invention;

FIG. 10B is a schematic representation of a target having an end surface with uniform layer of conductive material having a conductivity gradient in accordance with example embodiments of the invention;

FIG. 10C is a schematic representation of a target having a cut end surface with a layer of conductive material that may form a surface that can be parallel to a sensor.

DETAILED DESCRIPTION

Figure 1:
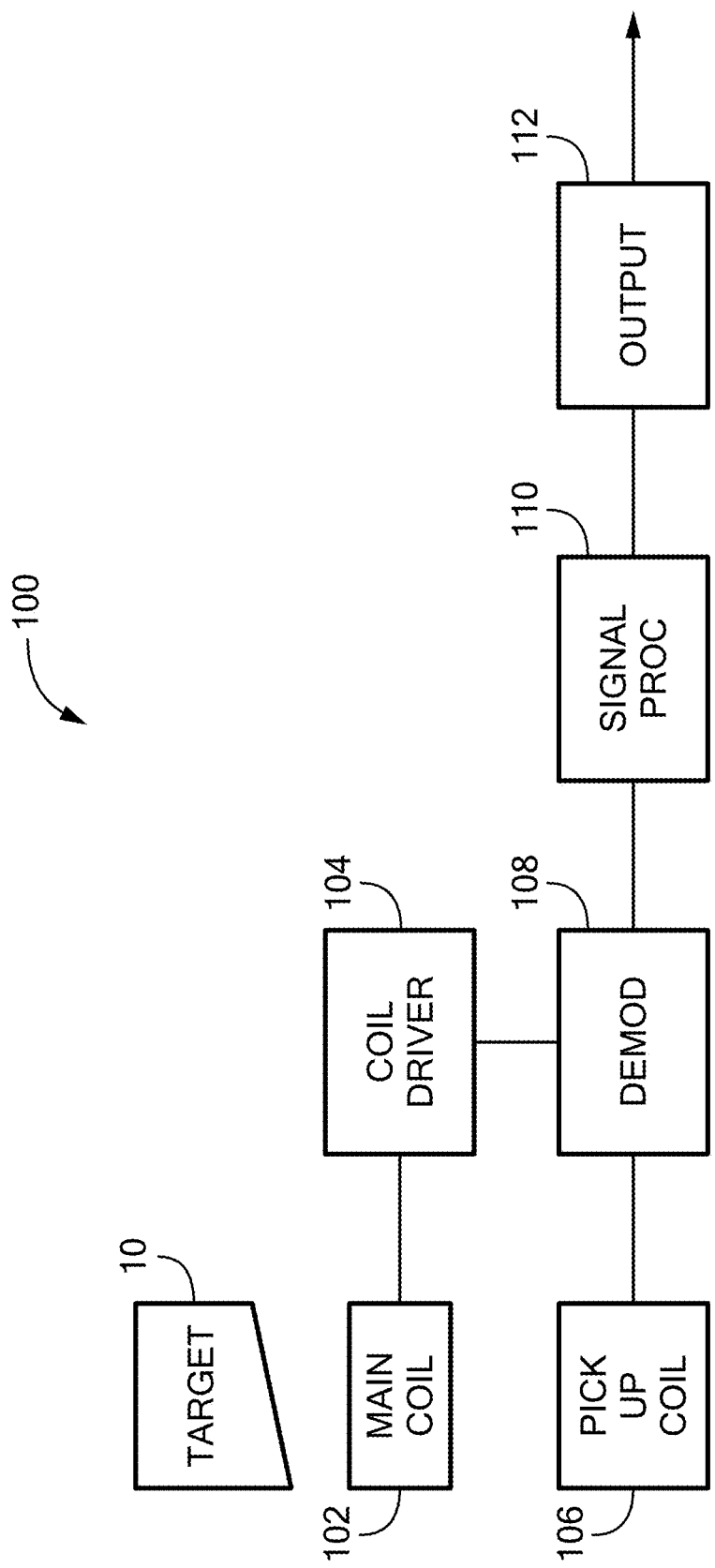
FIG. 1 is a block diagram of an angular position sensor using eddy currents in accordance with example embodiments of the invention.

FIG. 1 shows an angle sensor system 100 in accordance with example embodiments of the invention. The target 10 is located in proximity to the angle sensor to enable determination of angular position. In one embodiment, the target 10 comprises a cylinder with an at least partially conductive end surface proximate the angle sensor 100, and more particularly, a main coil 102. A coil driver module 104 energizes the main coil 102 with a signal that results in a signal reflected from the target 10. The reflected signal is received by a pick up coil module 106 and demodulated by a demodulator module 108. In embodiments, the pick up coil module 106 includes first and second coils arranged to enable sine and cosine signals to be generated and processed by a signal processing module 110. The signal processing module 110 can determine the angular position of the target 10 so that an output module 112 can output a signal corresponding to angular position of the target 10.

Figure 2:
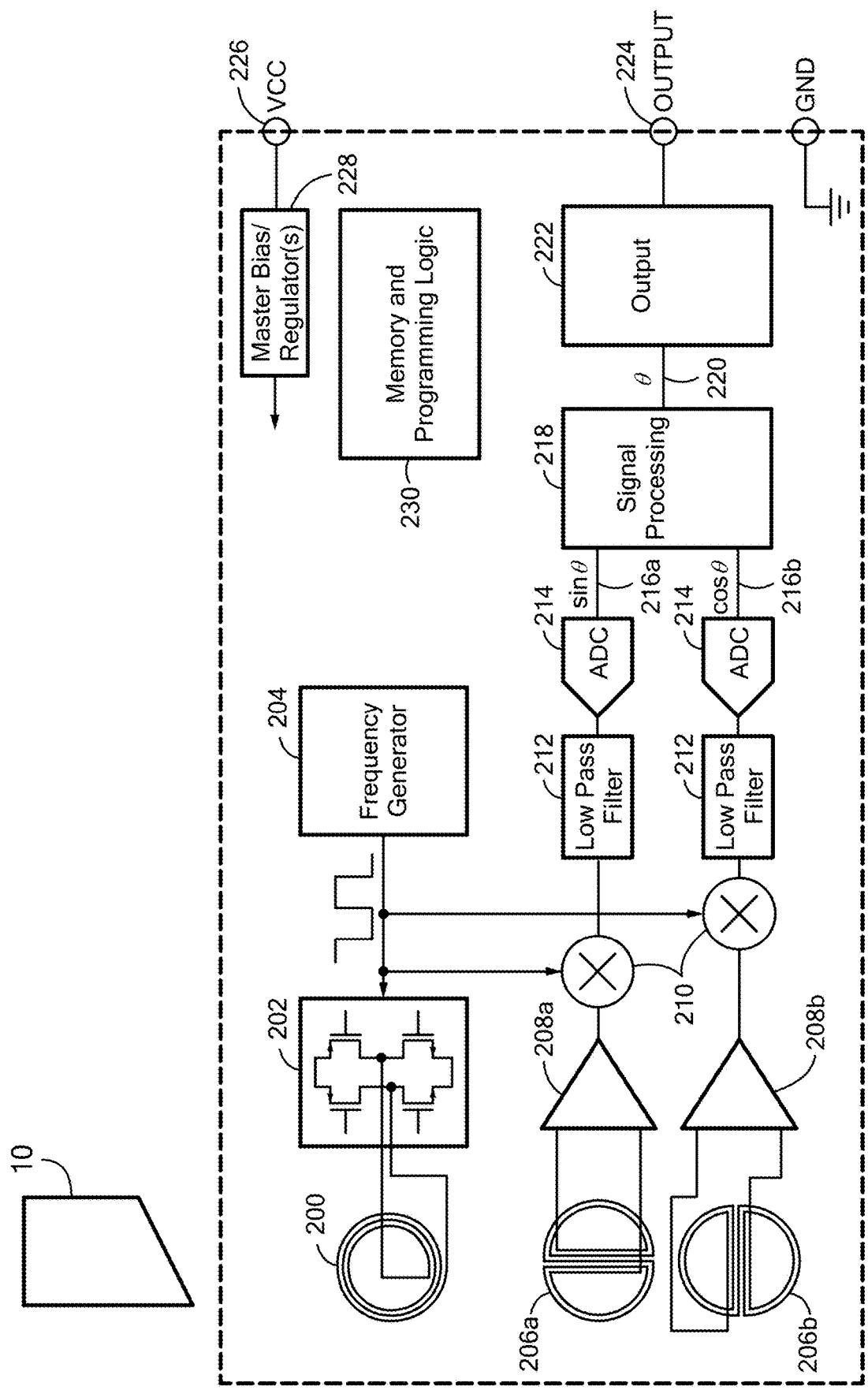
FIG. 2 is a block diagram of an angular position sensor using eddy currents in accordance with example embodiments of the invention.

FIG. 2 shows additional detail for an integrated circuit (IC) package implementation of the system of FIG. 1. A main coil 200 is driven by a coil driver 202 coupled to a frequency generator 204, for example. In embodiments, coil driver 202 supplies current to the main coil 200 to generate a magnetic field. An alternating current may be used so that the main coil 200 produces alternating magnetic fields (i.e. magnetic fields with magnetic moments that change over time). The field generated by the main coil 200 causes a reflected signal to be generated by the target 10 that is received by first and second pick up coils 206a,b and amplified by amplifiers 208a,b. In embodiments, the first coil 206a is configured to generate a sine signal and the second coil 206b is configured to generate a cosine signal. The amplified pick up signals for the first and second coils 206a,b are demodulated 210 to bring the high frequency signal down to DC since the magnetic signal will be at the same frequency as that in the main coil, so one uses that same frequency to demodulate down to DC. The sine and cosine signals can be filtered 212, such as with low pass filters 210, and digitized by analog-to-digital converters (ADC) 214.

The digitized sine and cosine signals 216a,b are provided to a signal processing module 218 to generate an angular position signal 220 that corresponds to the angular position θ of the target 10. In embodiments, the arc tangent function, e.g., $\tan^{-1} \sin\theta/\cos\theta$ can be used to determine angular position θ. In some embodiments, angular position processing is performed in the digital domain. In other embodiments, angular position processing is performed in the analog domain. The angular position signal can be received by an output module 222. In embodiments, the output module can perform signal linearization, calibration, and the like, of the position signal prior to output from the IC, for example, on an output pin 224.

The IC can include an IO pin 226 configured to receive a voltage supply signal VCC. A regulator module 228 can provide voltage signals throughout the IC and provide master bias and other functionality. The IC can further include memory 230 to store programming logic, provide volatile and/or non-volatile memory, and the like.

In example embodiments, the main coil 200 is energized with a signal having a frequency in the range of about 1 to about 10 MHz. It is understood that other frequencies can be used to meet the needs of a particular application.

Figure 3:
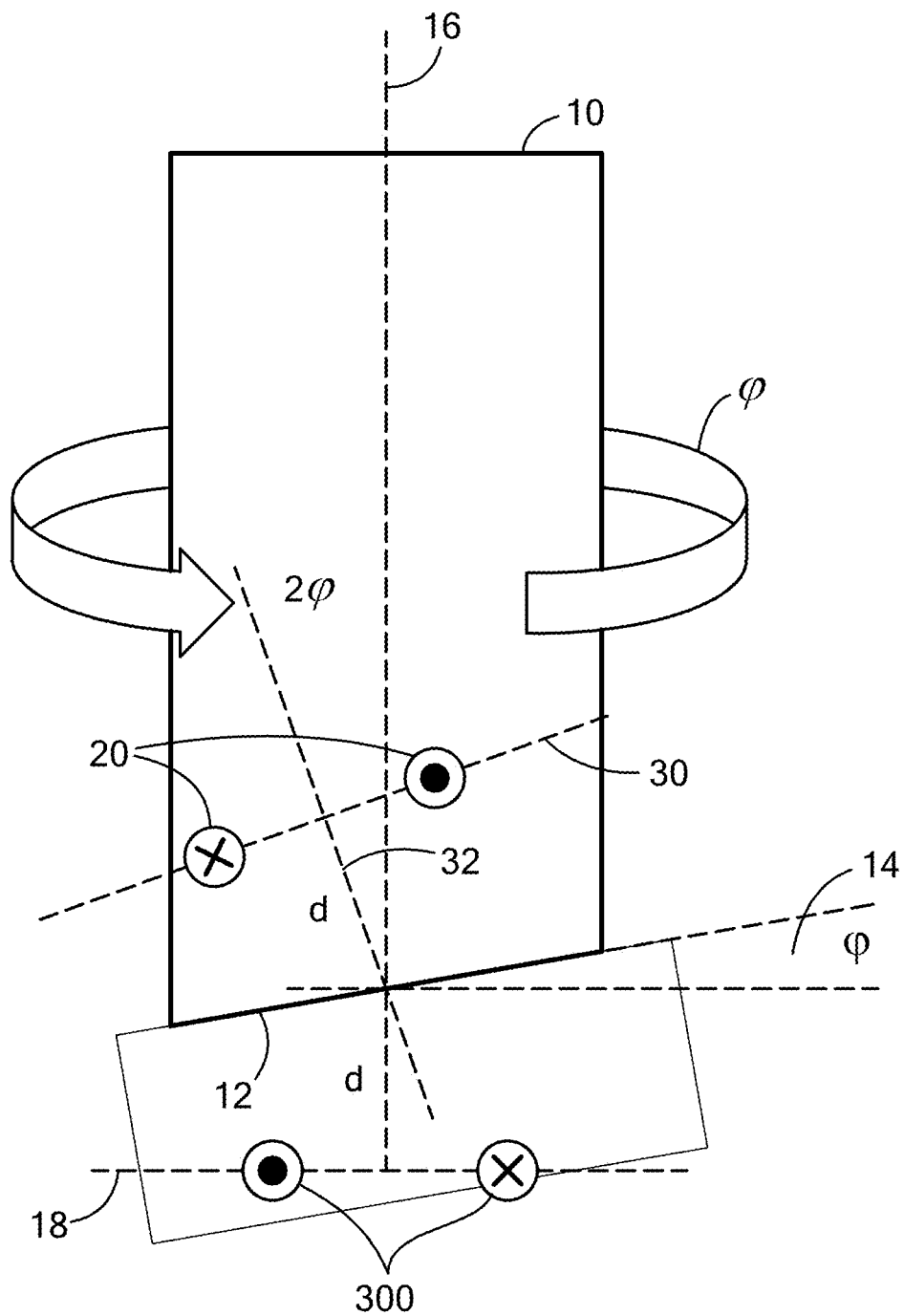
FIG. 3 is a schematic representation of a target having a cut end that is conductive for which angular position can be sensed in accordance with example embodiments of the invention.

FIG. 3 shows an example target 10 in the form of a cylinder having at an end 12 that is cut at an angle 14 shown as φ. In one embodiment, the angle 14 is defined in relation to a longitudinal axis 16 of the cylinder that is perpendicular to a plane/axis 18 in which the main coil 300 resides. The cut end 12 of the target is at least partially conductive. In some embodiments, at least the end 12 of the target is formed from a conductive material, such as aluminum. In some embodiments, a conductive material can be applied to the end 12 of the target, which may be formed from a conductive or non-conductive material. The cylinder 10 rotates about its longitudinal axis 16 with an angular position defined by θ while the main coil 300 radiates a magnetic field toward the end 12 of the cylinder. A mirrored coil 20 is shown at a distance from the end 12 of the target at a given location. It is understood that the mirrored coil is an idealized model, which assumes a perfect conductor and vacuum, that can be used to model the reflected field from the conductive target end. It is understood that an X in a circle indicates a current into the paper and a dot in a circle indicates a current coming out of the paper. An example range for the cut angle is about +/−45 degrees. In many embodiments, the cut angle is between about 5 and 15 degrees.

The end 12 of the target, at the axis 16 of the target, is located a distance d from the plane 18 of the main coil 300. The mirror coil 20 is located in a plane 30 that is bisected by a segment 32 extending perpendicularly from the mirror coil plane 30 such that an angle formed by segment 32 and the target longitudinal axis 16 is 2φ. The segment 32 extends a distance d from the end 12 of the target at the axis 16 to the plane 30 of the mirror coil 20.

As noted above, the main coil 300 causes a reflected field to emanate from the target 10. The reflected field can be modeled as the mirror coil 20. Pick up coils, as described above and below, can receive the reflected field and generate an angular position signal for the target 10.

In accordance with Maxwell's equations, the magnetic field from the main coil 300 induces Eddy currents in the conductive surface 12 of the target. In addition, an ideal conductor keeps AC magnetic flux lines from crossing its boundary which results in symmetry of the main and mirrored coil across the boundary of the conductor.

Figure 4:
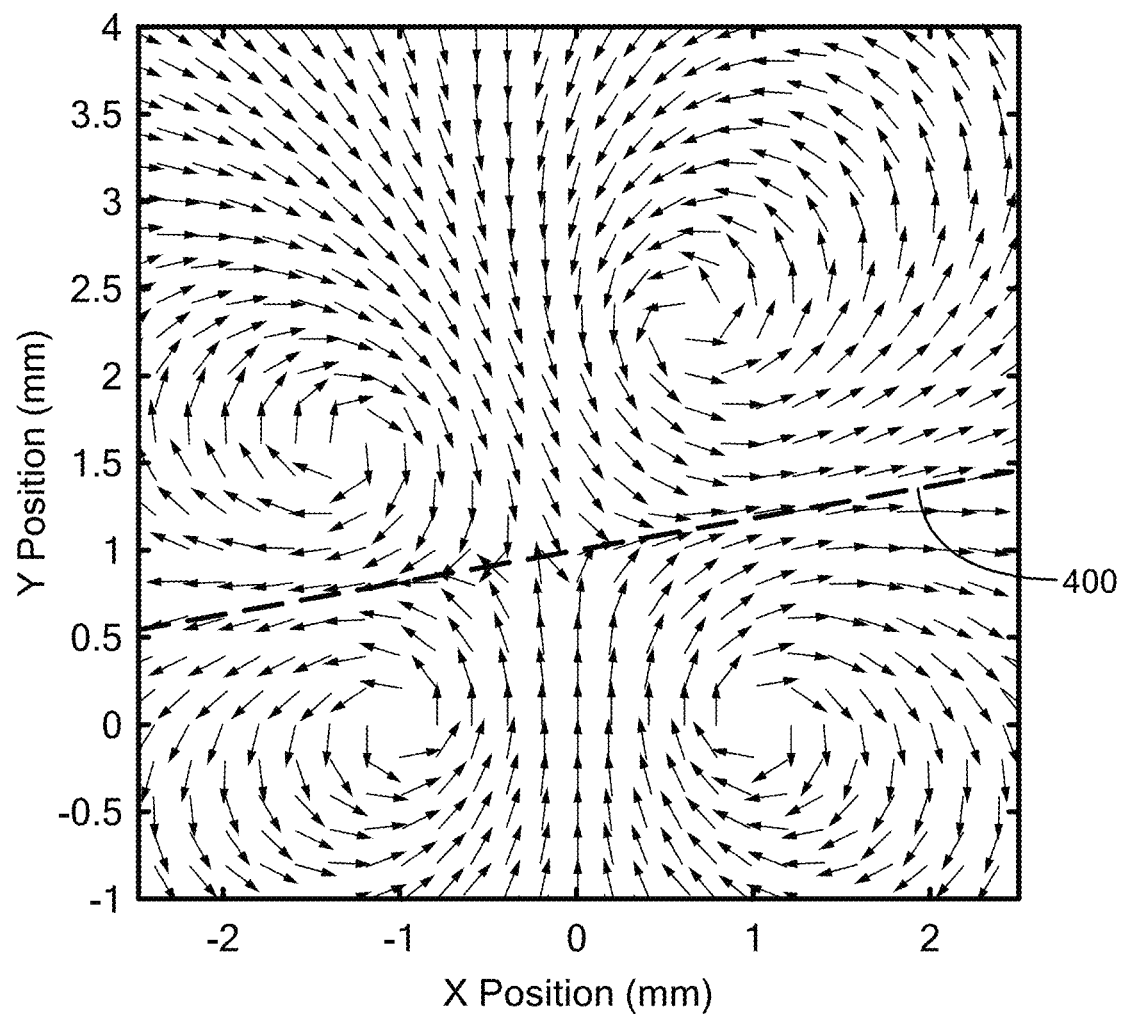
FIG. 4 is a graphical representation of the magnetic fields created when eddy currents are generated in a cut end surface of the target of FIG. 3 that can be used to determine an angle or rotation of the cut for the target in accordance with example embodiments of the invention.

FIG. 4 shows the combined field lines from a main coil and from a 'mirrored coil', which is located according to FIG. 3. The resulting fields never cross the target boundary 400. In operation, the main coil 300 applies a field on the target 10 that causes eddy currents to flow within the target. These eddy currents create their own magnetic fields that can be modeled as the mirror coil 20. In practice, currents will only flow on the surface of the target, but the effect will be as if the currents were flowing like mirror coil 20. It should be noted that Faraday's Law says that the voltage induced in a closed loop is proportional to the rate of change of the magnetic flux that the loop encloses. This means that an AC magnetic field crossing a sheet induces a voltage in the sheet. However, a perfect conductor cannot have a voltage induced on it, so, instead, currents develop on the surface to reject the magnetic field from going through the conductor. This is what one will see in a finite element simulation. However, one can model this behavior through symmetry. Basically, there is no field crossing the boundary by having symmetric coils (same size and current) across the boundary as shown in FIG. 3. That is not where the actual currents flow, as there is no magnetic field inside the conductor, but rather models the magnetic fields external to the conductor as if those surface currents were flowing. That means that in FIG. 4, the fields below the dashed line are the ones actually seen, and the ones above it will not exist in reality.

It will be appreciated that the cut angle provides an optimization. As one increases the cut angle, the angle of the reflected field increases, thereby increasing the differential seen by the pick-up coils, but one also has to increase distance d in order to keep the edge of the target from hitting the sensor, which reduces the field seen. In example embodiments, around 7.5 degrees provides the largest output signal for a 1 mm air-gap from the lowest point of the target to the sensor.

FIG. 5 shows a rotating target 10 subjected to a field from the main coil 300 generating a reflected signal 500 shown below the target. As can be seen, in the plane 18 of the main coil 300 the reflected signal from the mirror coil model is not symmetric. The asymmetric signal rotates about a rotation axis 502, which can correspond the target longitudinal axis 16, as the target 10 rotates. This asymmetric signal rotation can be detected by pickup coils. FIG. 5A shows the target rotated about 180 degrees and corresponding field.

The reflected signal 500 is generated from an example modelled system in which d=1 mm, θ=5°, r=1.5 mm (radius of main coil), where the main coil has outer radius of 1.5 mm and an inner radius of 1.05 mm. The current to the main coil 300 is 300 mA-turns. It is understood that only the mirrored coil is modelled in the illustrated embodiment. In embodiments, the main coil 300 field is substantially cancelled by differential pick up coils.

The reflected field is plotted as B in the z-direction, which is what the pick up coils detect. As can be seen, the strongest field level is off center towards the closer piece of the cylinder 10. The reflected field rotates with the cylinder/ target 10. With an offset reflected field, pick up coils centered on the main coil 300 will detect the off-center field.

It is understood that various types and arrangements of pick up coils can be used to meet the needs of a particular application. Coils can be circular, ovular, square, polygonal, and the like, and can have any practical width and thickness.

It is understood that the mutual inductance between the main and pickup coils changes as the target rotates. The mutual inductance is proportional to the sum of the fields directly produced by the main coil and reflected from the target, which the pick-up coils encompass. It is desirable to have low mutual inductance between the main coil and the pickup coils due to the direct field to enable sensing of the reflected field in the presence of the field generated by the main coil. Mutual inductance due to the direct field creates an offset that is constant over angle (theta), which can be large due to the close proximity of the coils, making it challenging to detect the small change in mutual inductance due to the reflected field changing over angle (theta). Where each of the pick-up coils encompass a total of near zero field from the main coil (note that encompassing field clockwise adds to the total and counterclockwise subtracts from the total), the mutual inductance due to the direct field will approach zero. That is, the pick-up coils are configured such that the net field from the main coil on the pick-up coils is substantially zero.

In embodiments, first and second sets of differential pick up coils detect the field from the mirrored coil. Differential coils may cancel out the direct field from the main coil. In one embodiment, first and second sets of coils are 90 degrees out of phase to yield sine and cosine outputs on which an arctangent can be used. Using sine and cosine signals may enhance immunity to system variations, e.g., airgap, temperature, frequency etc., as well as stray field immunity. In addition, DC fields will not be picked up by the coils, while uniform AC fields may be rejected by the differential coils.

Figure 6A:
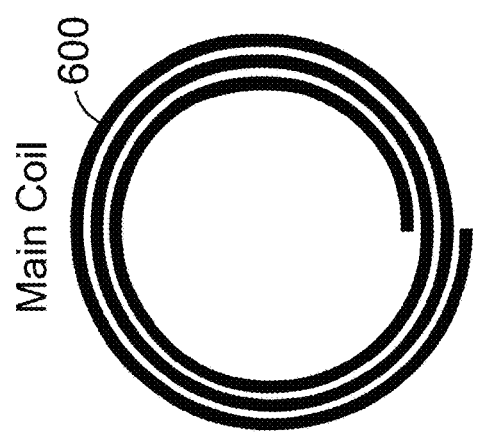
FIG. 6A is an example implementation of a main coil that can form at part of an angular position sensor using eddy currents in accordance with example embodiments of the invention.
Figure 6B:
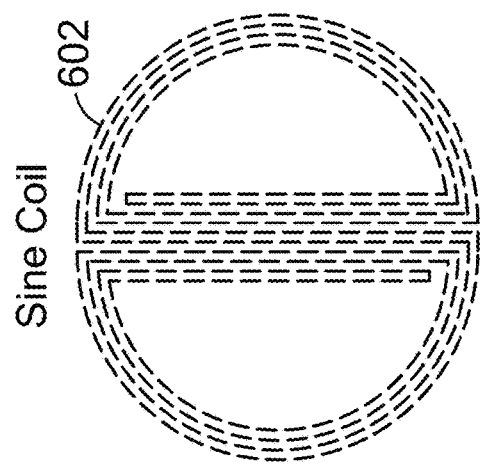
FIG. 6B is an example implementation of a first pick up coil that can form at part of an angular position sensor using eddy currents in accordance with example embodiments of the invention.
Figure 6C:
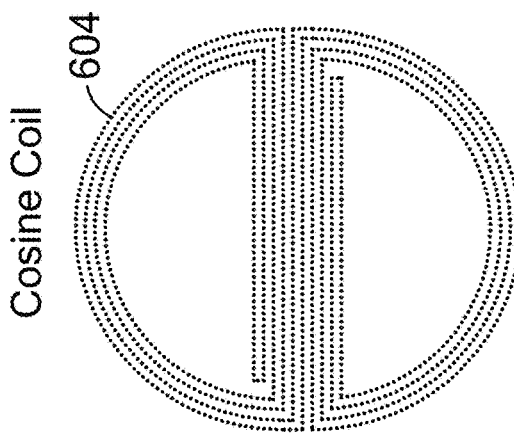
FIG. 6C is an example implementation of a second coil that can form at part of an angular position sensor using eddy currents in accordance with example embodiments of the invention.
Figure 6D:
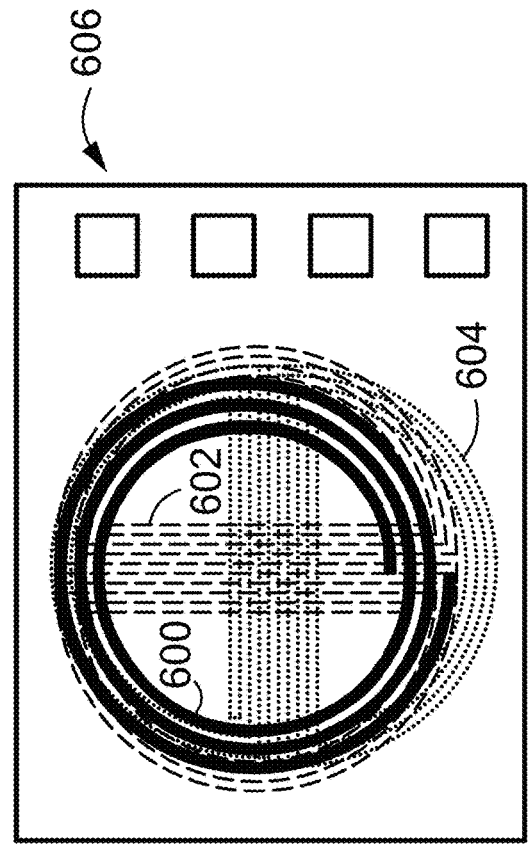
FIG. 6D is a schematic representation of an example configuration for the main coil of FIG. 6A, the first pick up coil of FIG. 6B, and the second pick up coil of FIG. 6C.

FIG. 6A shows an example configuration for a main coil 600, FIG. 6B shows an example configuration for a sine coil 602, and FIG. 6C shows an example configuration for a cosine coil 604. FIG. 6D shows an example embodiment of a stacked arrangement 606 in which the main coil 600, cosine coil 604, and sine coil 602 overlap each other, wherein each coil has about the same radius.

Figure 7C:
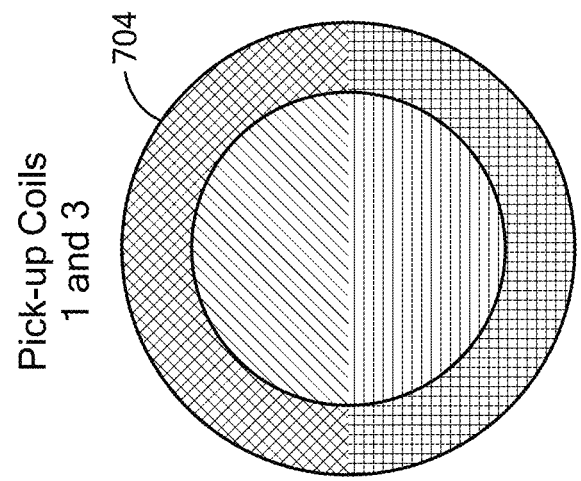
FIG. 7C is schematic representation of a second coil that can form at part of an angular position sensor using eddy currents in accordance with example embodiments of the invention.
Figure 7B:
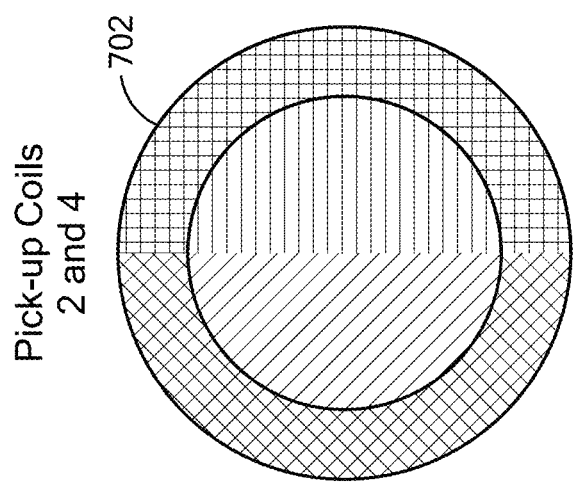
FIG. 7B is a schematic representation of a first pick up coil that can form at part of an angular position sensor using eddy currents in accordance with example embodiments of the invention.
Figure 7A:
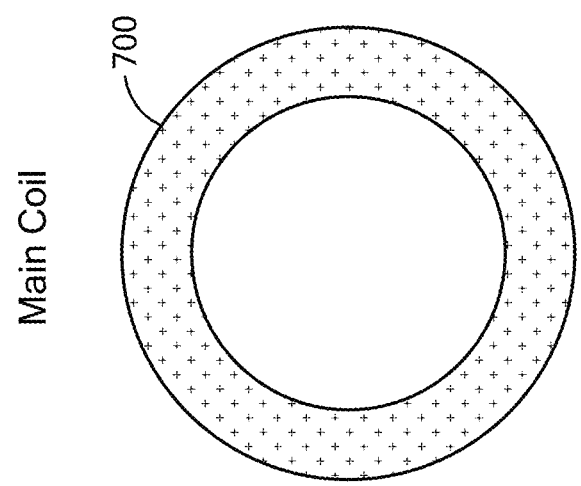
FIG. 7A is a schematic representation of a main coil that can form at part of an angular position sensor using eddy currents in accordance with example embodiments of the invention.

FIG. 7A shows a schematic representation 700 of the main coil 600 of FIG. 6A, FIG. 7B shows a schematic representation 702 of the sine coil 602 of FIG. 6B, and FIG. 7C shows a schematic representation 704 of the cosine coil of 604 of FIG. 6C. As can be seen, the sine coil 704 of FIG. 7C can be considered to have pick up coils 1 and 3 and the cosine coil 702 of FIG. 7B can be considered to have pick up coils 2 and 4.

Figure 8A:
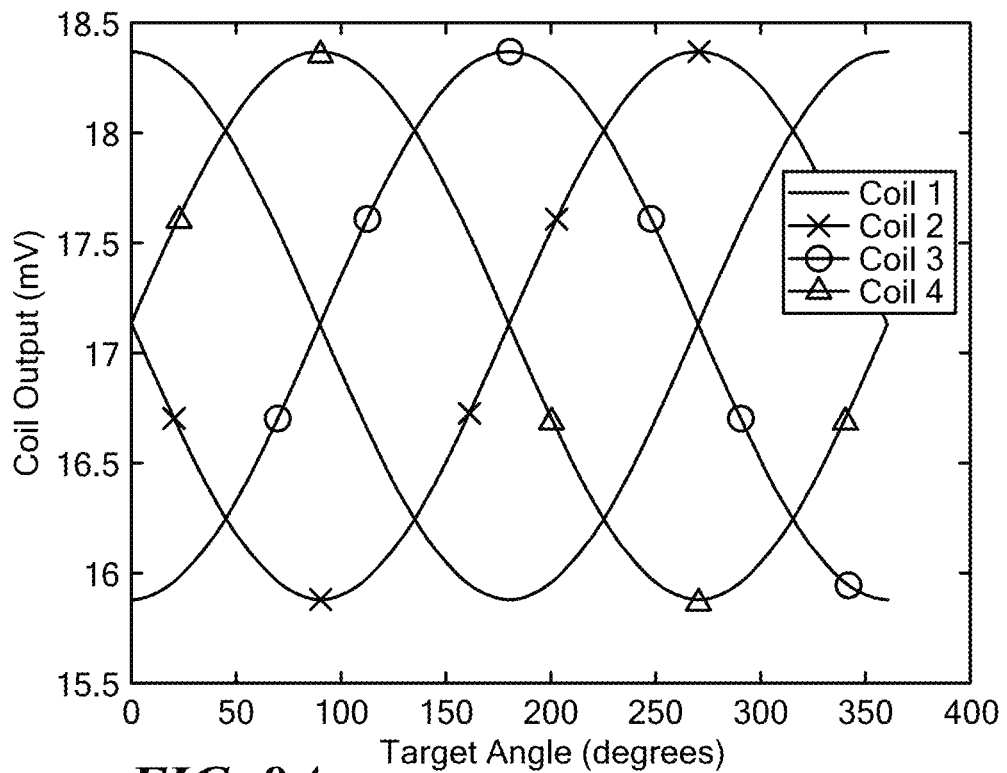
FIG. 8A is a graphical representation of outputs of the coils of FIGS. 7A-7C.
Figure 8B:
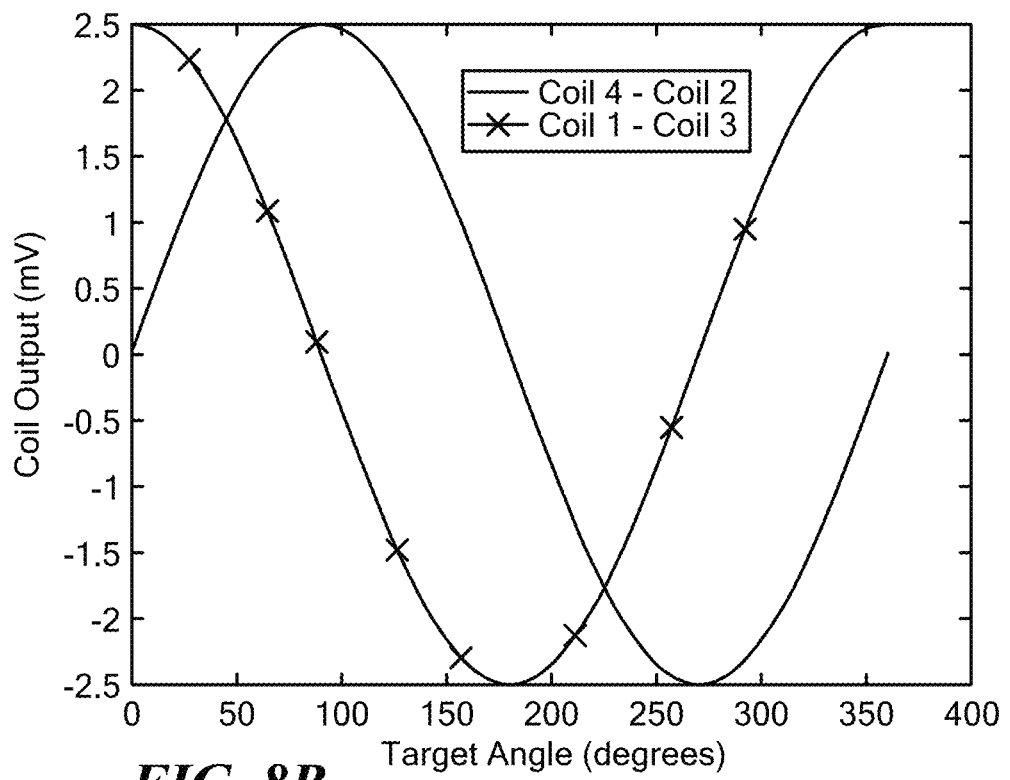
FIG. 8B is a graphical representation of since and cosine signals from the outputs of the coils of FIGS. 7A-7C.

FIG. 8A shows graphical representations of the signals for coil 1, coil 2, coil 3, and coil 4 versus target angle. FIG. 8B shows a graphical representation of a cosine output of (coil 4-coil 2) and a since output of (coil 1-coil 3) versus target angle. As can be seen, these signals are in quadrature, i.e., 90 degrees out of phase. Results shown are for a frequency of about 5 MHz, N=10, where N is the number of turns for the coils. As can be seen, one gets about 5 mV pk-pk out of each coil set.

In the illustrated embodiment, four pick up coils are used, each encompassing about half the area of the main coil and are rotated 90 degrees from each other. Coils 1 and 3 (704 FIG. 7C) are wound in opposite directions and connected in series. Coils 2 and 4 (702 FIG. 7B) are wound in opposite directions and connected in series. It will be appreciated that the illustrated configuration results in substantially zero output from each coil set for common field, including the main coil. When the target rotates, one gets a sine output from one coil set and a cosine output from the other coil set. In general, the sine and cosine coils should be aligned accurately since asymmetry may cause offset errors.

It is understood that a variety of techniques can be used to fabricate coils and other circuit features. In embodiments, additional metal layers can be added to standard processes. For example, in one particular embodiment, a relatively thick top layer can be used for the main coil and five or six metal layer processing can be used for the sine and cosine coils. In some embodiments, pick-up coils may only cover about 90 degrees of area so as to reduce the number of layers required. Coils can be created on a PCB or separate IC for use with an interface IC to allow for larger coils that would work over a larger air gap, and thereby allow use of a smaller die.

In other embodiments, magnetic field sensing elements, such as Hall elements and magnetoresistance (MR) elements, can be used to pick up the reflected high frequency signals. It is understood that one can re-pin the MR structure to get a quadrature relationship.

Figure 8C:
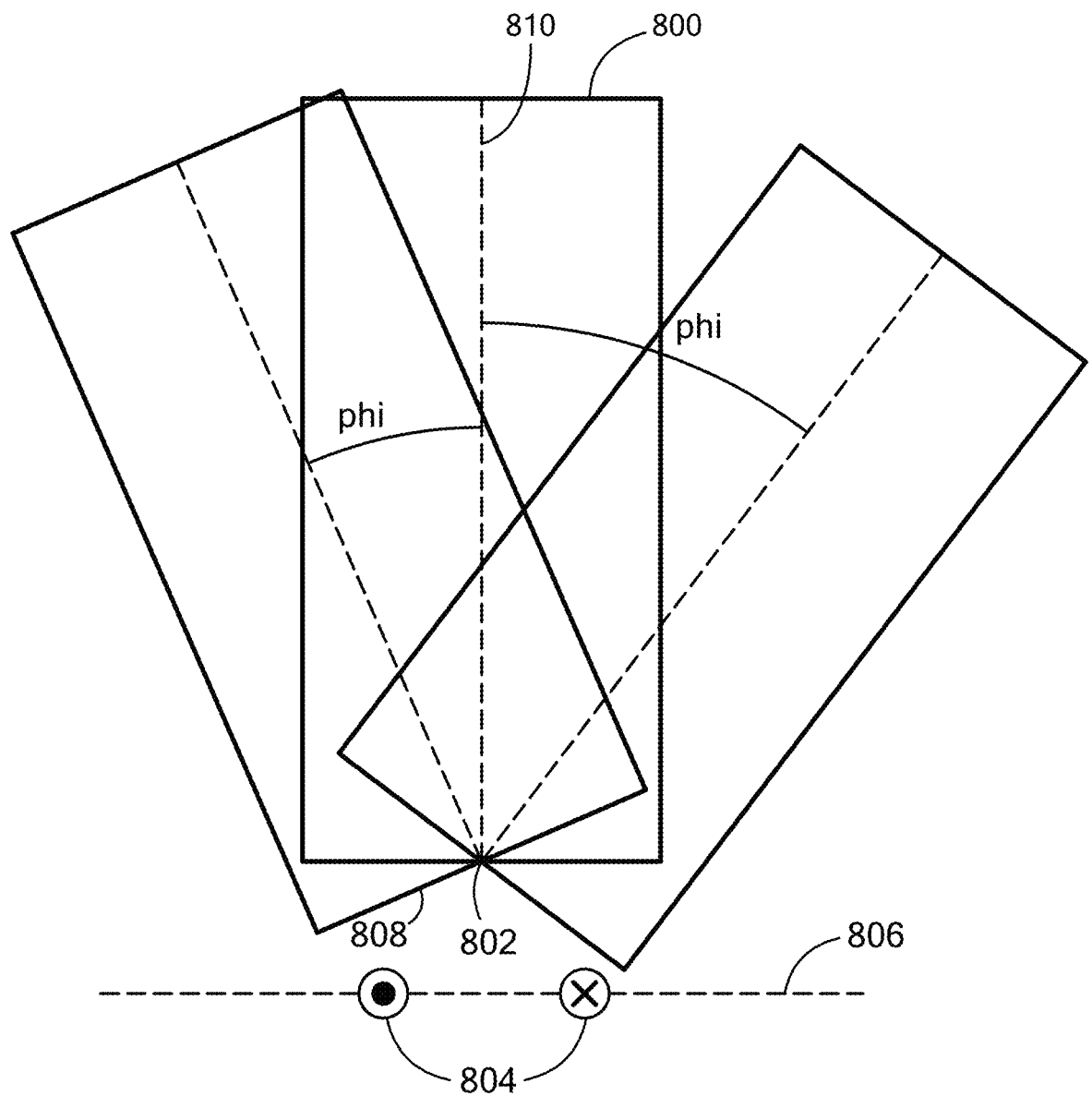
FIG. 8C shows a target that can pivot with respect to a main coil.

In an example embodiment shown in FIG. 8C, a target 800 can pivot about a point 802 located above a main coil 804 and main coil plane 806. An end 808 of the target 800 rotates to define an angle phi with respect to a longitudinal axis 810 of the target. A sensor (not shown), such as the pick-up coils shown in in FIG. 6, can detect the reflected field as the target 800 pivots to determine a slope of the target.

In some embodiments, the coils may be configured to reduce capacitive coupling between coils, e.g., main coil to pick-up coils and pick-up coil to pick-up coil, since such coupling may cause unwanted cross-talk between coils.

Figure 8F:
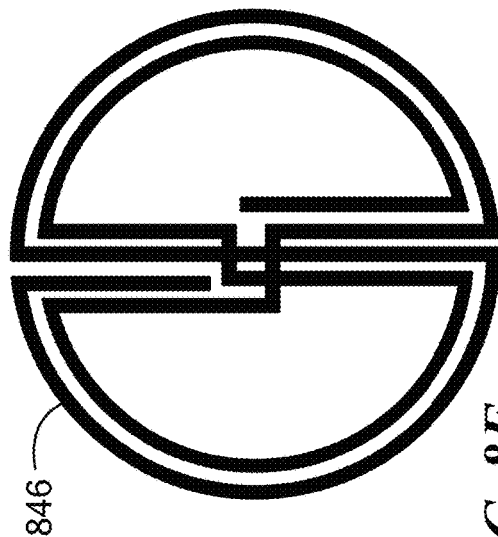
FIG. 8F shows an example coil arrangement.
Figure 8G:
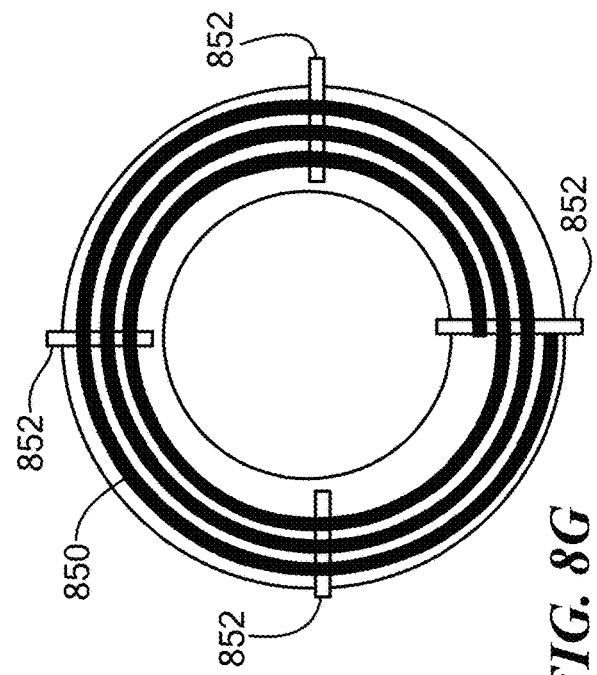
FIG. 8G shows an example coil arrangement with slots to reduce eddy currents.
Figure 8D:
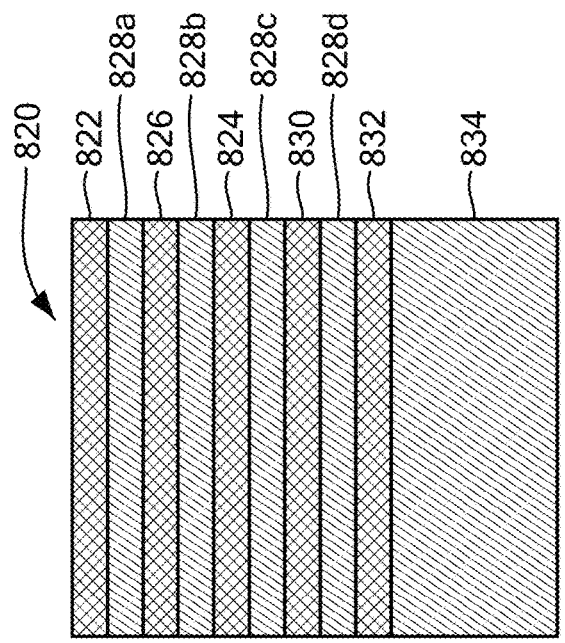
FIG. 8D shows an example coil layer configuration.

FIG. 8D shows an example coil configuration 820 that adds shielding between coils. In the illustrated embodiment, a main coil layer 822 is separated from a sine coil layer 824 with a grounded shield layer 826 between dielectric layers 828*a,b*. A cosine coil layer 830 is separated from the sine coil layer 824 by dielectric layer 828*c*. A grounded shield layer 832 is separated from the cosine coil layer 830 by dielectric layer 828*d*. In embodiments, the layers can be formed on a substrate 834, such as a silicon substrate. It is understood that alternative embodiments include layers in different orders with more or less dielectric layers and/or more or less shield layers.

In other embodiments, the coils are at least partially interdigitated for less coil overlap for reducing capacitance.

Figure 8E:
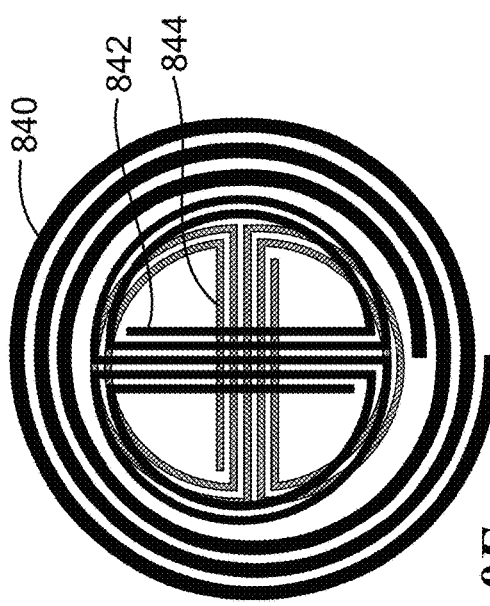
FIG. 8E shows an example coil stack up configuration.

FIG. 8E shows a stacked coil arrangement having some similarity to the arrangement shown in FIG. 6D. While the main, sine, and cosine coils overlap in FIG. 6D, in the embodiment of FIG. 8E, the main coil 840 is wound in a greater diameter to reduce or eliminate overlap with the sine coil 842 and cosine coil 844.

FIG. 8F shows an embodiment of a coil 846 for reducing common mode voltage from inductive coupling by distributing the positive and negative mutual inductance from the main coil throughout the pick-up coil. In a spiral design (see, for example, the coil of FIG. 6B), there may be mutual inductance to the two halves of the pick-up coil from the main coil. The net mutual inductance is only due to the reflections from the coil, but the average mutual inductance of the two halves may lead to a large common mode motion (not as large as the capacitive issue but still significant). By distributing the positive and negative mutual inductance in the FIG. 8F configuration, common mode motion is created and destroyed in each turn of the coil to prevent build up. In this way, the common mode voltage is reduced from the spiral case, e.g., FIG. 6B, by around 1/N, where N is the number of turns in the coil.

FIG. 8G shows an example embodiment of a main coil 850 with slots 852 formed in a conductive layer 844 (e.g., one of the shield layers in FIG. 8D) to reduce eddy currents, which can degrade accuracy of the sensor. It is understood that any practical number of slots can be used in any suitable location to meet the needs of a particular location. FIG. 8G also shows how the conductive shield layer 844 exists between the coils and does not need to fill the entire region.

Figure 9:
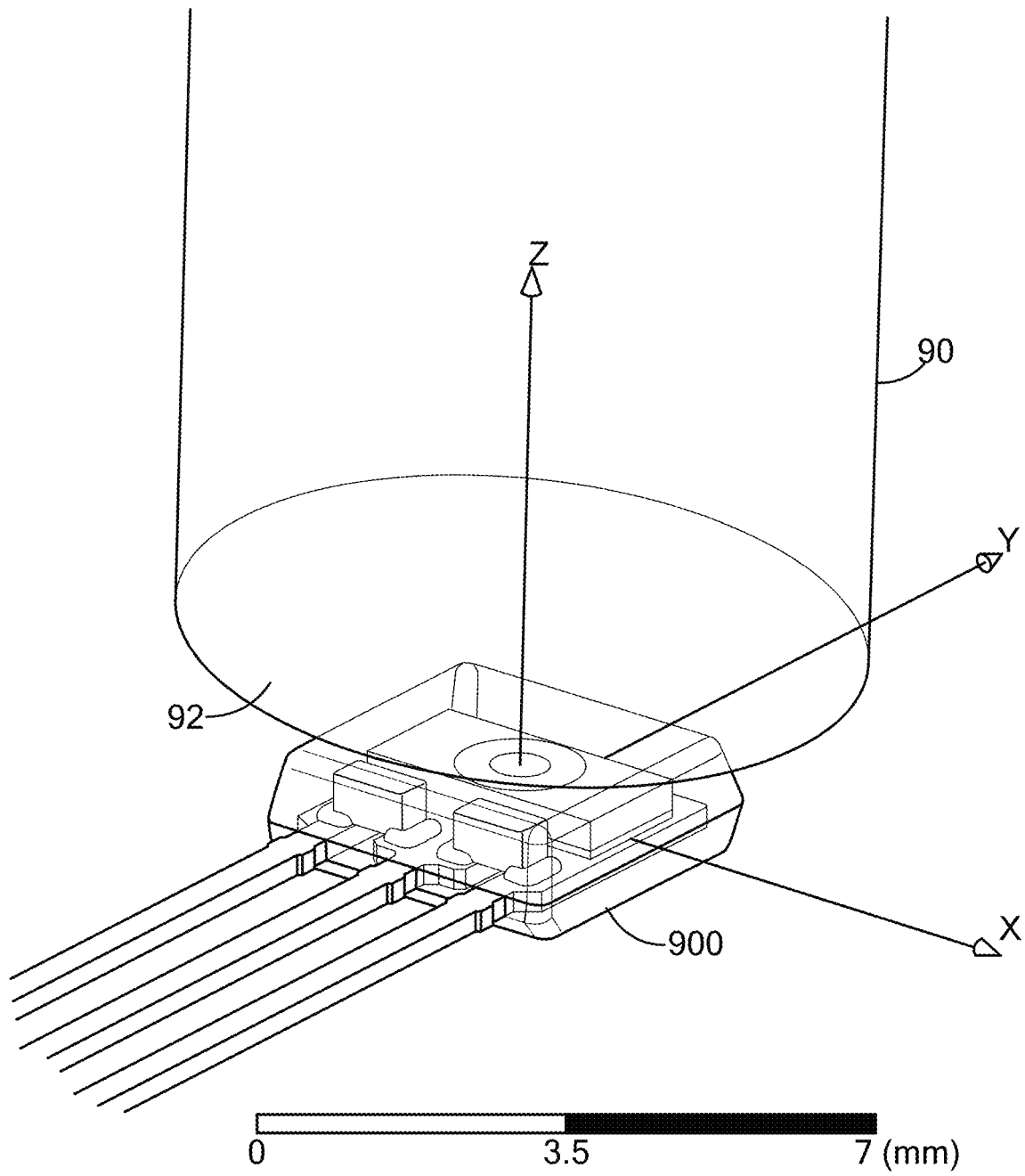
FIG. 9 is a schematic representation of angular position sensor IC package using eddy currents in accordance with example embodiments of the invention.

FIG. 9 shows an example embodiment of an angular position sensor IC package 900 with a target 90 at a given air gap. The target 90 is shown as a cylinder having a cut end 92. The sensor 900 has a give die size that allows for a 1.5 mm diameter coil in the example embodiment. A 1.3 mm from die-face to target center results in the order of a 1 mm airgap from package face of the IC package 900 to lowest portion of the target 90, e.g., a 8 mm diameter rod.

FIG. 10A shows an example target 1000 with a layer of conductive material 1002 on an end surface 1004 of the target. In one embodiment, the target 1000 comprises a cylinder with 90 degree cuts at each end. The conductive material 1002 is applied to the end surface 1004 such that one side 1006 of the end surface has conductive material 1002 with a first thickness and the other side 1008 of the end surface 1004 has conductive material 1002 with a second thickness that is less than the first thickness. The varying thickness of the conductive material 1002 provides a conductivity gradient across the end surface 1004 of the target. The varying thickness of the conductive material 1002 may create a reflected field having some similarity with the target having a cut end, as described above.

FIG. 10B shows an example target 1020 with a layer of conductive material 1022 on an end surface 1024 of the target 1020. In one embodiment, the target 1020 comprises a cylinder with 90 cuts at each end. The conductive material 1022 is applied to the end surface 1024 with a substantially uniform thickness. The conductive material 1022 has properties that create a conductivity gradient across the end surface 1024 of the target. In an example embodiment, first and second materials are mixed in varying proportions to create the conductive material 1022 of uniform thickness and varying conductivity. The varying conductivity of the conductive material 1022 may create a reflected field having some similarity with the target having a cut end, as described above.

FIG. 10C shows an example target 1040 with a layer of conductive material 1042 on a cut end surface 1024 of the target 1040. The conductive material 1022 is applied to the end surface 1024 with a thickness to form a parallel surface to a sensor.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element. The target may comprise a conductive material that allows for eddy currents to flow within the target, for example a metallic target that conducts electricity.

Figure 11:
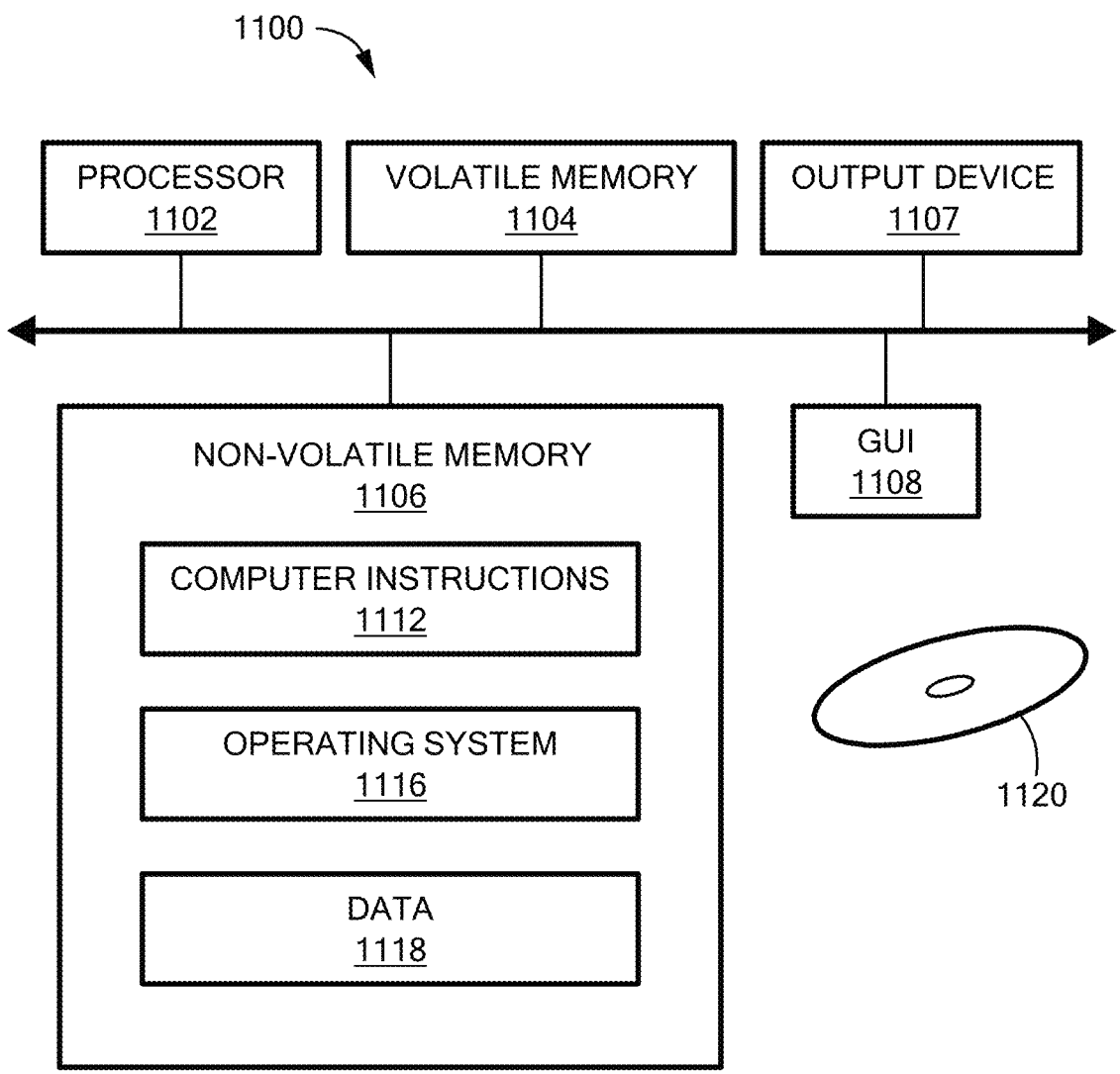
FIG. 11 is a schematic representation of an example computer that can perform at least a portion of the processing described herein.

FIG. 11 shows an exemplary computer 1100 that can perform at least part of the processing described herein. The computer 1100 includes a processor 1102, a volatile memory 1104, a non-volatile memory 1106 (e.g., hard disk), an output device 1107 and a graphical user interface (GUI) 1108 (e.g., a mouse, a keyboard, a display, for example). The non-volatile memory 1106 stores computer instructions 1112, an operating system 1116 and data 1118. In one example, the computer instructions 1112 are executed by the processor 1102 out of volatile memory 1104. In one embodiment, an article 1120 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A sensor, comprising:
a main coil to direct a magnetic field at a rotatable target for inducing eddy currents in the target;
differential pick-up coils for detecting a reflected field from the target wherein each of the pick up coils is configured such that an asymmetric reflected field from the target seen by the pick-up coils corresponds to conductive properties of a surface of the target in relation to the main coil and the pick-up coils; and
a processing module to process the reflected magnetic field from the pick-up coils for determining an angular position of the target,
wherein the target comprises a cylinder and an end of the cylinder is cut at an angle corresponding to the asymmetric reflected field from the target.

2. The sensor according to claim 1, wherein the target is configured to rotate about an axis of the target.

3. The sensor according to claim 1, wherein the angle corresponds to locations of eddy currents generated in the target by the main coil.

4. The sensor according to claim 1, wherein the reflected field is generated by the induced eddy currents in the conductive surface, and wherein the reflected field is asymmetrical about an axis of the target.

5. The sensor according to claim 1, wherein each of the pick-up coils is configured such that an average field from the main coil on the pick-up coils is substantially zero.

6. The sensor according to claim 1, wherein a first one of the pick up coils generates a sine signal corresponding to the angular position of the target and a second one of the pick-up coils includes a cosine signal corresponding to the angular position of the target.

7. The sensor according to claim 6, wherein the processing module is configured for arc tangent processing of the sine and cosine signals to determine the angular position of the target.

8. The sensor according to claim 1, wherein a strength of the reflected magnetic field corresponds to a distance between the end of the target and the main coil.

9. The sensor according to claim 1, where an end of the target comprises a conductive material defining the conductive properties of the surface of the target.

10. The sensor according to claim 9, wherein the conductive material varies in thickness to vary the conductivity of the end of the target.

11. The sensor according to claim 1, wherein the pick-up coils comprise first and second matching coils that are ninety degrees out of phase with respect to each other.

12. The sensor according to claim 1, wherein at least one ground plane is placed between the main and/or pick-up coils.

13. The sensor according to claim 12, wherein the at least one ground plane includes at least one slot to reduce eddy current generation from the main coil.

14. The sensor according to claim 1, wherein the main coil and pick-up coils are at least partially interdigitated.

15. The sensor according to claim 1, wherein the sensor is formed on a single integrated circuit.

16. The sensor according to claim 1, wherein one or more of the main coil and the pick-up coils is on a separate substrate.

17. The sensor according to claim 1, wherein the pick-up coils comprise two half spirals.

18. The sensor according to claim 1, wherein the pick-up coils comprise concentric coils.

19. A method, comprising:
employing a main coil to direct a magnetic field at a rotatable target for inducing eddy currents in the target;
employing differential pick-up coils for detecting a reflected field from the target wherein each of the pick-up coils is configured such that an asymmetric reflected field from the target seen by the pick-up coils corresponds to conductive properties of a surface of the target in relation to the main coil and the pick-up coils; and
processing the reflected magnetic field from the pick-up coils for determining an angular position of the target,
wherein the target comprises a cylinder and an end of the cylinder is cut at an angle corresponding to the asymmetric reflected field from the target.

20. The method according to claim 19, wherein the target is configured to rotate about an axis of the target.

21. The method according to claim 19, wherein the angle corresponds to locations of eddy currents generated in the target by the main coil.

22. The method according to claim 19, wherein the reflected field is generated by the induced eddy currents in the conductive surface, and wherein the reflected field is asymmetrical about an axis of the target.

23. The method according to claim 19, wherein each of the pick-up coils is configured such that an average field from the main coil on the pick-up coils is substantially zero.

24. The method according to claim 19, wherein a first one of the pick-up coils generates a sine signal corresponding to the angular position of the target and a second one of the pick-up coils includes a cosine signal corresponding to the angular position of the target.

25. The method according to claim 19, wherein a strength of the reflected magnetic field corresponds to a distance between the end of the target and the main coil.

26. The method according to claim 19, where an end of the target comprises a conductive material defining the conductive properties of the surface of the target.

27. The method according to claim 19, wherein the pick-up coils comprise first and second matching coils that are ninety degrees out of phase with respect to each other.

28. The method according to claim 19, wherein at least one ground plane is placed between the main and/or pick-up coils.

29. The method according to claim 28, wherein the at least one ground plane includes at least one slot to reduce eddy current generation from the main coil.

30. The method according to claim 19, wherein the pick-up coils comprise two half spirals.

31. The method according to claim 19, wherein the pick-up coils comprise concentric coils.

32. A sensor, comprising:
a main coil means for directing a magnetic field at a rotatable target for inducing eddy currents in the target;
differential pick-up coil means for detecting a reflected field from the target wherein the differential pick-up coil means comprises pick up coils each configured such that an asymmetric reflected field from the target seen by the pick-up coils corresponds to conductive properties of a surface of the target in relation to the main coil means and the pick-up coils; and a processing means for processing the reflected magnetic field from the pick-up coils for determining an angular position of the target, wherein the target comprises a cylinder and an end of the cylinder is cut at an angle corresponding to the asymmetric reflected field from the target.

33. A sensor, comprising:

a main coil to direct a magnetic field at a rotatable target for inducing eddy currents in the target;

differential pick-up coils for detecting a reflected field from the target wherein each of the pick up coils is configured such that an asymmetric reflected field from the target seen by the pick-up coils corresponds to conductive properties of a surface of the target in relation to the main coil and the pick-up coils; and a processing module to process the reflected magnetic field from the pick-up coils for determining an angular position of the target, wherein a first one of the pick up coils generates a sine signal corresponding to the angular position of the target and a second one of the pick-up coils includes a cosine signal corresponding to the angular position of the target.

34. The sensor according to claim 33, wherein the target is configured to rotate about an axis of the target.

35. The sensor according to claim 33, wherein the reflected field is generated by the induced eddy currents in the conductive surface, and wherein the reflected field is asymmetrical about an axis of the target.

36. The sensor according to claim 33, wherein each of the pick-up coils is configured such that an average field from the main coil on the pick-up coils is substantially zero.

37. The sensor according to claim 33, wherein the processing module is configured for arc tangent processing of the sine and cosine signals to determine the angular position of the target.

38. The sensor according to claim 33, wherein a strength of the reflected magnetic field corresponds to a distance between the end of the target and the main coil.

39. The sensor according to claim 33, where an end of the target comprises a conductive material defining the conductive properties of the surface of the target.

40. The sensor according to claim 39, wherein the conductive material varies in thickness to vary the conductivity of the end of the target.

41. The sensor according to claim 33, wherein the pick-up coils comprise first and second matching coils that are ninety degrees out of phase with respect to each other.

42. The sensor according to claim 33, wherein at least one ground plane is placed between the main and/or pick-up coils.

43. The sensor according to claim 42, wherein the at least one ground plane includes at least one slot to reduce eddy current generation from the main coil.

44. The sensor according to claim 33, wherein the main coil and pick-up coils are at least partially interdigitated.

45. The sensor according to claim 33, wherein the sensor is formed on a single integrated circuit.

46. The sensor according to claim 33, wherein one or more of the main coil and the pick-up coils is on a separate substrate.

47. The sensor according to claim 33, wherein the pick-up coils comprise two half spirals.

48. The sensor according to claim 33, wherein the pick-up coils comprise concentric coils.

49. A sensor, comprising:

a main coil to direct a magnetic field at a rotatable target for inducing eddy currents in the target;

differential pick-up coils for detecting a reflected field from the target wherein each of the pick up coils is configured such that an asymmetric reflected field from the target seen by the pick-up coils corresponds to conductive properties of a surface of the target in relation to the main coil and the pick-up coils; and a processing module to process the reflected magnetic field from the pick-up coils for determining an angular position of the target, wherein the pick-up coils comprise first and second matching coils that are ninety degrees out of phase with respect to each other.

50. The sensor according to claim 49, wherein the target is configured to rotate about an axis of the target.

51. The sensor according to claim 49, wherein the reflected field is generated by the induced eddy currents in the conductive surface, and wherein the reflected field is asymmetrical about an axis of the target.

52. The sensor according to claim 49, wherein each of the pick-up coils is configured such that an average field from the main coil on the pick-up coils is substantially zero.

53. The sensor according to claim 49, wherein a strength of the reflected magnetic field corresponds to a distance between the end of the target and the main coil.

54. The sensor according to claim 49, where an end of the target comprises a conductive material defining the conductive properties of the surface of the target.

55. The sensor according to claim 54, wherein the conductive material varies in thickness to vary the conductivity of the end of the target.

56. The sensor according to claim 49, wherein at least one ground plane is placed between the main and/or pick-up coils.

57. The sensor according to claim 56, wherein the at least one ground plane includes at least one slot to reduce eddy current generation from the main coil.

58. The sensor according to claim 49, wherein the main coil and pick-up coils are at least partially interdigitated.

59. The sensor according to claim 49, wherein the sensor is formed on a single integrated circuit.

60. The sensor according to claim 49, wherein one or more of the main coil and the pick-up coils is on a separate substrate.

61. The sensor according to claim 49, wherein the pick-up coils comprise two half spirals.

62. The sensor according to claim 49, wherein the pick-up coils comprise concentric coils.

63. A method, comprising:

employing a main coil to direct a magnetic field at a rotatable target for inducing eddy currents in the target;

employing differential pick-up coils for detecting a reflected field from the target wherein each of the pick-up coils is configured such that an asymmetric reflected field from the target seen by the pick-up coils corresponds to conductive properties of a surface of the target in relation to the main coil and the pick-up coils; and processing the reflected magnetic field from the pick-up coils for determining an angular position of the target, wherein a first one of the pick-up coils generates a sine signal corresponding to the angular position of the target and a second one of the pick-up coils includes a cosine signal corresponding to the angular position of the target.

64. The method according to claim 63, wherein the target is configured to rotate about an axis of the target.

65. The method according to claim 63, wherein the reflected field is generated by the induced eddy currents in the conductive surface, and wherein the reflected field is asymmetrical about an axis of the target.

66. The method according to claim 63, wherein each of the pick-up coils is configured such that an average field from the main coil on the pick-up coils is substantially zero.

67. The method according to claim 63, wherein a strength of the reflected magnetic field corresponds to a distance between the end of the target and the main coil.

68. The method according to claim 63, where an end of the target comprises a conductive material defining the conductive properties of the surface of the target.

69. The method according to claim 63, wherein the pick-up coils comprise first and second matching coils that are ninety degrees out of phase with respect to each other.

70. The method according to claim 63, wherein at least one ground plane is placed between the main and/or pick-up coils.

71. The method according to claim 70, wherein the at least one ground plane includes at least one slot to reduce eddy current generation from the main coil.

72. The method according to claim 63, wherein the pick-up coils comprise two half spirals.

73. The method according to claim 63, wherein the pick-up coils comprise concentric coils.

74. A method, comprising:
employing a main coil to direct a magnetic field at a rotatable target for inducing eddy currents in the target;
employing differential pick-up coils for detecting a reflected field from the target wherein each of the pick-up coils is configured such that an asymmetric reflected field from the target seen by the pick-up coils corresponds to conductive properties of a surface of the target in relation to the main coil and the pick-up coils; and
processing the reflected magnetic field from the pick-up coils for determining an angular position of the target, wherein the pick-up coils comprise first and second matching coils that are ninety degrees out of phase with respect to each other.

75. The method according to claim 74, wherein the target is configured to rotate about an axis of the target.

76. The method according to claim 74, wherein the reflected field is generated by the induced eddy currents in the conductive surface, and wherein the reflected field is asymmetrical about an axis of the target.

77. The method according to claim 74, wherein each of the pick-up coils is configured such that an average field from the main coil on the pick-up coils is substantially zero.

78. The method according to claim 74, wherein a strength of the reflected magnetic field corresponds to a distance between the end of the target and the main coil.

79. The method according to claim 74, where an end of the target comprises a conductive material defining the conductive properties of the surface of the target.

80. The method according to claim 74, wherein the pick-up coils comprise first and second matching coils that are ninety degrees out of phase with respect to each other.

81. The method according to claim 74, wherein at least one ground plane is placed between the main and/or pick-up coils.

82. The method according to claim 81, wherein the at least one ground plane includes at least one slot to reduce eddy current generation from the main coil.

83. The method according to claim 74, wherein the pick-up coils comprise two half spirals.

84. The method according to claim 74, wherein the pick-up coils comprise concentric coils.

* * * * *